(12) United States Patent
DeVries et al.

(10) Patent No.: US 7,408,206 B2
(45) Date of Patent: Aug. 5, 2008

(54) METHOD AND STRUCTURE FOR CHARGE DISSIPATION IN INTEGRATED CIRCUITS

(75) Inventors: Kenneth L. DeVries, Hopewell Junction, NY (US); Nancy Anne Greco, LaGrangeville, NY (US); Joan Preston, Wimberley, TX (US); Stephen Larry Runyon, Pflugerville, TX (US)

(73) Assignee: International Business Machines Corporation, Armonk, NY (US)

( * ) Notice: Subject to any disclaimer, the term of this patent is extended or adjusted under 35 U.S.C. 154(b) by 431 days.

(21) Appl. No.: 11/164,377

(22) Filed: Nov. 21, 2005

(65) Prior Publication Data

US 2007/0115606 A1 May 24, 2007

(51) Int. Cl.
*H01L 29/017* (2006.01)
(52) U.S. Cl. .................. 257/127; 257/170; 257/409; 257/452; 257/484; 257/605; 257/E29.012
(58) Field of Classification Search .............. 257/127, 257/170, 409, 452, 484, 605, E29.012
See application file for complete search history.

(56) References Cited

U.S. PATENT DOCUMENTS 4,994,883 A * 2/1991 Chang et al. .............. 257/288

| | | | |
|---|---|---|---|
| 2002/0167053 A1* | 11/2002 | Huang .................. | 257/355 |
| 2007/0013072 A1* | 1/2007 | Ellis-Monaghan et al. .. | 257/758 |
| 2007/0218667 A1* | 9/2007 | Rider .................. | 438/585 |
| 2007/0221990 A1* | 9/2007 | Cote et al. .................. | 257/347 |

* cited by examiner

*Primary Examiner*—Thanh V Pham
(74) *Attorney, Agent, or Firm*—Schmeiser, Olsen & Watts; Steven Capella

(57) ABSTRACT

Methods and structures and methods of designing structures for charge dissipation in an integrated circuit on an SOI substrate. A first structure includes a charge dissipation ring around a periphery of the integrated circuit chip and one or more charge dissipation pedestals physically and electrically connected to the charge dissipation pedestals. The silicon layer and bulk silicon layer of the SOI substrate are connected by the guard ring and the charge dissipation pedestals. The ground distribution grid of the integrated circuit chip is connected to an uppermost wire segment of one or more charge dissipation pedestals. A second structure, replaces the charge dissipation guard ring with additional charge dissipation pedestal elements.

16 Claims, 12 Drawing Sheets

METHOD AND STRUCTURE FOR CHARGE DISSIPATION IN INTEGRATED CIRCUITS

FIELD OF THE INVENTION

The present invention relates to the field of integrated circuits; more specifically, it relates to charge dissipation structures for an integrated circuit as well as methods of fabricating the charge dissipation structures and a method of designing integrated circuit chips having the charge dissipation structure.

BACKGROUND OF THE INVENTION

When integrated circuits are fabricated on silicon-on-insulator (SOI) substrates, an oxide layer lies between the bulk silicon and the silicon layer in which active devices are fabricated. The oxide layer effectively electrically isolates the functional circuits of the integrated circuit chip from the bulk silicon portion of the substrate allowing charge to buildup in various circuit nodes of the integrated circuit during and after fabrication.

While various schemes have been developed to dissipate this charge buildup, the increasingly harsh processing environments in terms of total charge that may be pumped into an integrated circuit and decreasing device robustness in terms of resistance to charge buildup have rendered these schemes ineffective. Thus there is a need for improved charge dissipation structures, methods of fabricating improved charge dissipation structures and a method for designing integrated circuit chips having improved charge dissipation structures.

SUMMARY OF THE INVENTION

A first aspect of the present invention is an integrated circuit chip, comprising: an silicon on insulator substrate comprising a bulk silicon substrate, a buried oxide layer on a top surface of the bulk silicon substrate, and a silicon layer on a top surface of the buried oxide layer, the buried oxide layer electrically isolating the silicon layer from the bulk silicon substrate; a region of shallow trench isolation formed in the silicon layer and extending from the top surface of the buried oxide layer to a top surface of the silicon layer; a charge dissipation guard ring comprising a continuous polysilicon ring disposed adjacent to sides of the integrated circuit chip and at least a continuous band of a metal contact ring aligned over and in direct physical and electrical contact with a corresponding continuous band of a top surface of the polysilicon ring, of the metal contact ring in the polysilicon ring extending from a top surface of the region of shallow trench isolation, through the shallow trench isolation and through the buried oxide layer in direct physical and electrical contact with the bulk silicon substrate, the polysilicon ring electrically isolated from the silicon layer by the region of shallow trench isolation; and one or more charge dissipation pedestals, each charge dissipation pedestal of the one or more charge dissipation pedestals comprising a stack of wire segments from a lowermost to a higher most wire segment of each wiring level of the integrated circuit chip, a lowermost wire segment of the stack of wire segments in direct physical and electrical contact with the metal contact ring, each wire segment of the stack of wire segments in direct physical and electrical contact with a lower and a higher wire segment.

A second aspect of the present invention is the first aspect, wherein the continuous metal contact ring comprises a lower continuous ring and a separate upper continuous ring, a continuous band of a top surface of the lower continuous ring in direct physical and electrical contact with a continuous band of a bottom surface of the upper continuous ring.

A third aspect of the present invention is the first aspect, further including a functional circuit region containing an integrated circuit, the functional circuit region disposed within and spaced at least a first predetermined distance from the guard ring and spaced at least a second predetermined distance from each of the one or more charge dissipation pedestals.

A fourth aspect of the present invention is the third aspect, wherein the first and second minimum distances are a same distance.

A fifth aspect of the present invention is the third aspect, wherein the integrated circuit includes a ground distribution grid electrically coupled to the silicon layer and physically and electrically connected to the uppermost wire segment of at least one of the one or more charge dissipation pedestals.

A sixth aspect of the present invention is the first aspect, further including:

a functional circuit region containing an integrated circuit, either the guard ring and at least one of the one or more charge dissipation pedestals disposed within the functional circuit region or at least one of the one or more charge dissipation pedestals disposed within the functional circuit region.

An seventh aspect of the present invention is the first aspect wherein the integrated circuit includes a ground distribution grid electrically coupled to the silicon layer and physically and electrically connected to the uppermost wire segment of at least one of the one or more charge dissipation pedestals An eighth aspect of the present invention is the seventh aspect, wherein the one or more of the one or more charge dissipation pedestals are disposed over one or more different corners of the guard ring, over one or more sides of the guard ring or both over one or more different corners of and one or more sides of the guard ring.

A ninth aspect of the present invention is the first aspect, further including a continuous crack stop disposed between the sides of the integrated circuit chip and the charge dissipation guard ring and charge dissipation pedestals.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

A damascene process is one in which wire trenches or via openings are formed in a dielectric layer, an electrical conductor of sufficient thickness to fill the trenches is deposited on a top surface of the dielectric, and a chemical-mechanical-polish (CMP) process is performed to remove excess conductor and make the surface of the conductor co-planer with the surface of the dielectric layer to form damascene wires (or damascene vias). When only a trench and a wire (or a via opening and a via) is formed the process is called single-damascene.

A dual-damascene process is one in which via openings are formed through the entire thickness of a dielectric layer followed by formation of trenches part of the way through the dielectric layer in any given cross-sectional view. All via openings are intersected by integral wire trenches above and by a wire trench below, but not all trenches need intersect a via opening. An electrical conductor of sufficient thickness to fill the trenches and via opening is deposited on a top surface of the dielectric and a CMP process is performed to make the surface of the conductor in the trench co-planer with the surface the dielectric layer to form dual-damascene wires and dual-damascene wires having integral dual-damascene vias. Alternatively, the via opening may be formed before the trenches.

The electrical conductor of single damascene wires and dual-damascene wires/vias may comprise a thin conformal electrically conductive liner formed on the sidewalls and bottom of the trench/via opening and filled to the top of the trench/via opening with a electrically conductive core material.

While the various embodiments of the present invention are described using single and dual-damascene structures and fabrication methods, other types of interconnect wiring may be used. For example, wires and vias formed by subtractive etch of blanket metal films may be substituted for one or more of the single and/or dual-damascene wires/vias.

Figure 1:
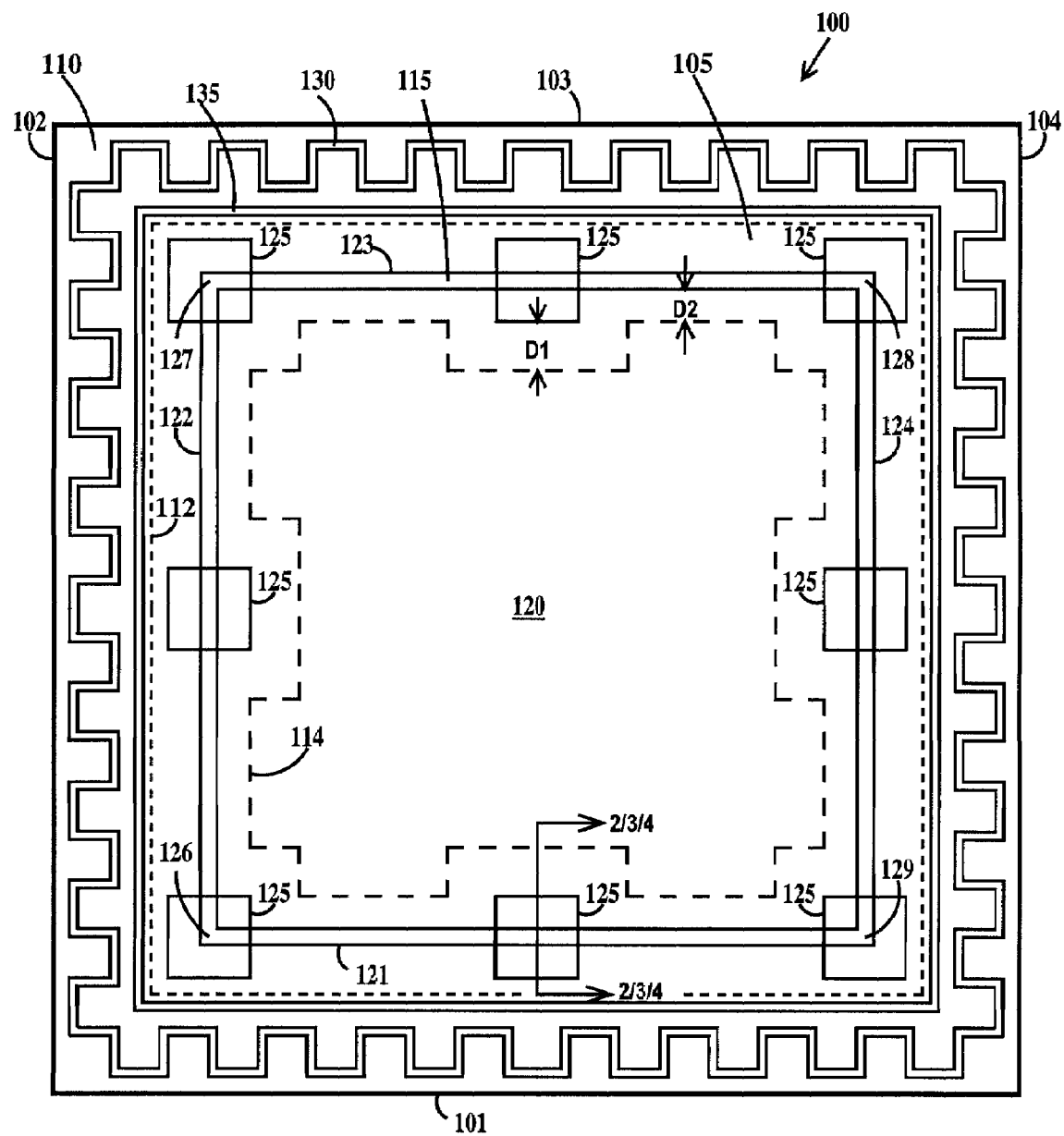
FIG. 1 is a plan view of an integrated circuit chip according to various embodiments of the present invention.

FIG. 1 is a plan view of an integrated circuit chip according to various embodiments of the present invention. In FIG. 1, a periphery of an integrated circuit chip 100 is defined by sides 101, 102, 103 and 104, with sides 101 and 103 being opposite each other and parallel, sides 102 and 104 being opposite each other and parallel, and sides 101 and 103 perpendicular to sides 102 and 103. Integrated circuit chip 100 includes a functional circuit region 105 and a kerf region 110 sharing a common boundary defined by dashed line 112.

Functional circuit region 105 includes a charge dissipation guard ring (hereinafter guard ring) 115 immediately adjacent to and surrounding a functional circuit region 120, the functional circuit region defined by dashed line 114. Functional circuit region 120 includes active and passive devices and interconnection wires (not shown) required for a fully functional integrated circuit within a region 120. Guard ring 115 includes sides 121, 122, 123 and 124, with sides 121 and 123 being opposite each other and parallel to each other and to sides 101 and 103, sides 122 and 124 being opposite each other and parallel to each other and to sides 102 and 104.

Functional circuit region 105 further includes exemplary charge dissipation pedestals (hereinafter pedestals) 125 aligned over corners 126, 127, 128 and 129 of guard ring 115 and aligned over guard ring 115 between corners 126, 127, 128 and 129. For any particular integrated circuit chip, at least one pedestal 125 must be present. There may be none or one or more than one pedestals 125 over each side 121, 122, 123 and 124 of guard ring 115 and the number of pedestals over each side of the guard ring may be different. Likewise, there may a pedestal 125 over none, one, two, three or four of corners 126, 127, 128 and 129.

Guard ring 115 comprises at least a trench formed through the silicon layer and buried oxide layer (BOX) of a silicon on insulator (SOI) substrate that is filled with polysilicon. Guard ring 115 may further comprise vertically stacked rings of metal formed at the contact levels of the integrated circuit chip. The vertical direction is perpendicular to the plane of the drawing. Contact levels are those levels that electrically connect devices such as transistors, resistors and capacitors to the via and/or wiring levels of an integrated circuit. Some contact levels only interconnect devices and do not contact the via/wiring levels as explained infra.

Pedestals 125 comprise vertically stacked segments of each via or wiring level. Pedestals 125 may include the contact levels if not included in guard ring 115. Pedestals 125 may include a polysilicon, tungsten or other electrically conductive material filled bulk substrate contact through the silicon layer and BOX layer of an SOI substrate if there is no guard ring at all. Various embodiments of guard ring and pedestals structures are described in further detail, infra.

Kerf region 110 includes an optional continuous serpentine crack stop 130 immediately adjacent to and sides 101, 102, 103 and 104 of integrated circuit chip 100. Crack stop 130 comprises a trench formed through the silicon layer and BOX of an SOI substrate that is filled with polysilicon. The purpose of crack stop 130 is to prevent cracks in sides of 101, 102, 103 and 104 of integrated circuit chip 100 from penetrating to an optional barrier ring 135, guard ring 115 or functional circuit region 105. Crack stops comprising straight sides rather than serpentine sides may be used as well.

Barrier ring 135 is a continuous ring formed between crack stop 130 and guard ring 115 and pedestals 125 in functional circuit region 105. Barrier ring 135 comprises vertically stacked rings of metal formed at each metal contact, via or wiring level of the integrated circuit chip. There is no polysilicon ring contacting the substrate and barrier ring 135 is electrically isolated from the substrate. The top surface of a lower metal ring in barrier 135 in contact with a bottom surface of an immediately higher metal ring in the stack, with no gaps between rings. Barrier ring 135 prevents moisture and other contaminants from diffusing from sides 101, 102, 103 and 104 of integrated circuit chip 100 into functional circuit region 105. While one barrier ring is illustrated in FIG. 1, there may be multiple concentric barrier rings.

Pedestals 125 are located no closer than a distance D1 from functional chip circuit 120 and guard ring 115 is located no closer than a distance D2 from functional circuit region 120. No electrically conductive structures may be located between pedestals 125 and guard ring 115 and functional circuit region 120.

Distance D1 is advantageously great enough to prevent discharge of accumulate charge from various fabrication steps, such as plasma etches and depositions from functional circuit region 120 to pedestals 125. Distance D2 is advantageously great enough to prevent discharge of accumulate charge from various fabrication steps, such as plasma etches and depositions from functional circuit region 120 to guard ring 115. In one example, D1 is equal to D2. In one example, D1 is different from D2.

In one example, D1 is the same distance for each different wiring level (or contact level) of pedestals 125. In one example, D1 may be a different distance for each wiring level (or contact level) of pedestals 125 based on a minimum wire (or via) width and/or space between adjacent wires (or vias) of each wiring level (or contact level). In one example, D1 is at least about 5.0 microns.

In one example, D2 is the same distance for each fabrication level forming a portion of guard ring 115. In one example, D2 may be a different distance for each included fabrication level of guard ring 115 based on a minimum feature width and/or space between adjacent features of each included fabrication level. In one example, D2 is at least about 5.0 microns.

Figure 2:
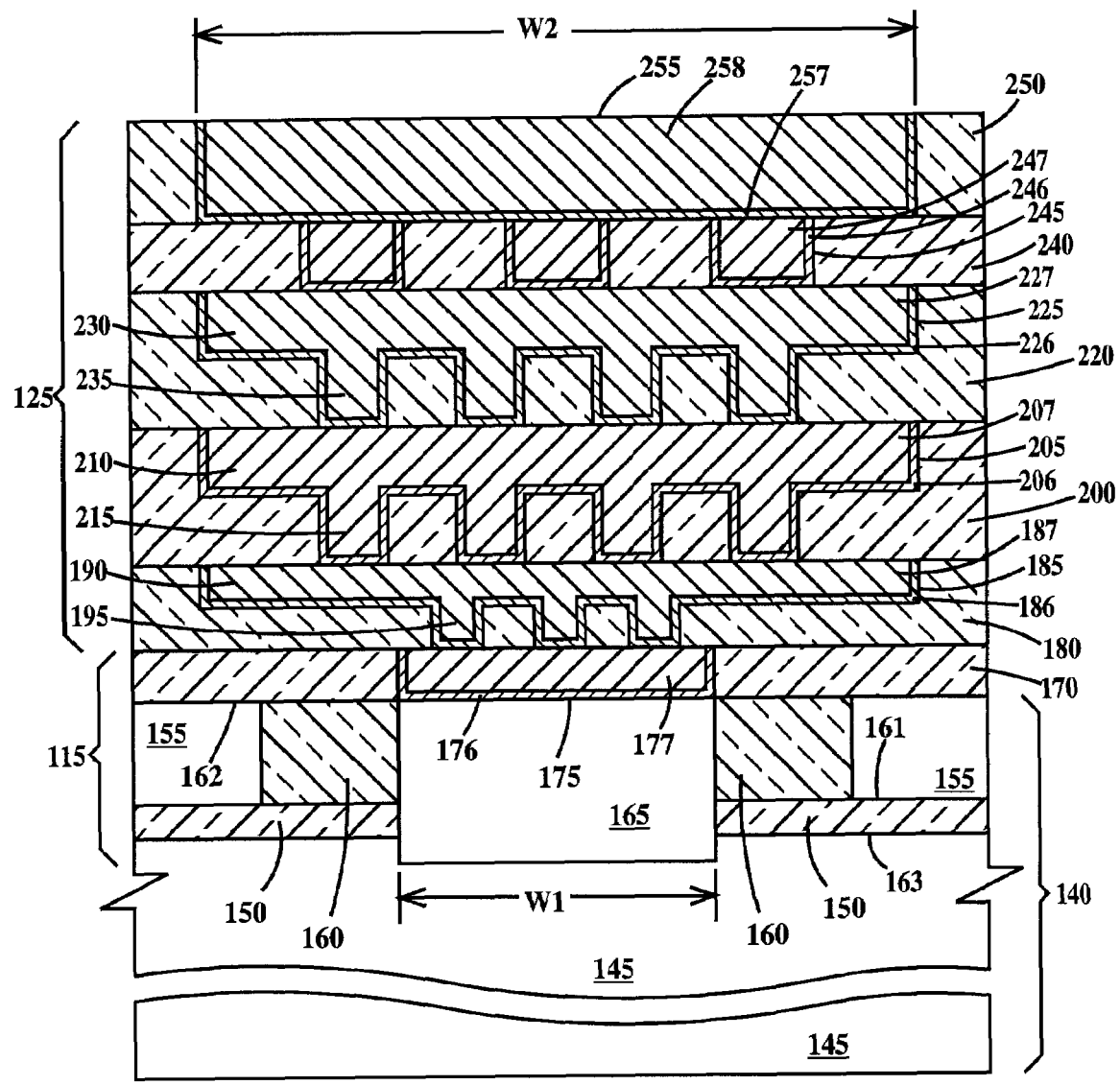
FIG. 2 is a cross-section through line 2-2 of FIG. 1, illustrating a first embodiment of the present invention.

FIG. 2 is a cross-section through line 2-2 of FIG. 1, illustrating a first embodiment of the present invention. In FIG. 2, an SOI substrate 140 comprises a bulk silicon substrate 145 and a BOX 150 separating and electrically isolating a silicon layer 155 from the bulk silicon substrate. Formed in silicon layer 155 is a shallow trench isolation (STI) 160 extending from a top surface 161 of BOX 150 to top surface 162 of SOI substrate 140.

In the first embodiment of the present invention, guard ring 115 comprises a polysilicon or tungsten guard ring 165 electrically isolated from silicon layer 155 by STI 160 and extending from top surface 161 of SOI substrate through silicon layer 155, through BOX 150 into bulk silicon substrate 145. Alternatively, polysilicon or tungsten guard ring 165 may just physically and electrically contact a surface 163 of bulk silicon substrate 145. In either case, polysilicon or tungsten guard ring 165 is in electrical contact with bulk silicon substrate 145. Guard ring 115 further includes, formed in a dielectric layer 170 formed on top surface 162 of SOI substrate 140, a single damascene contact guard ring 175 in direct physical and electrical contact with polysilicon or tungsten guard ring 165. The fabrication level of contact guard ring 175 may be designated as contact level (CA). Contact guard ring 175 is illustrated as having the same width (W1) as polysilicon or tungsten guard ring 165. Alternatively, contact guard ring 175 may have a greater or lesser width than polysilicon or tungsten guard ring 165. Contact guard ring 175 comprises an electrically conductive liner 176 and a electrical core conductor 177.

In a first example, polysilicon or tungsten guard ring 165 comprises undoped polysilicon. In second example, polysilicon or tungsten guard ring 165 comprises N or P doped polysilicon. In one example, conductive liner 176 is selected from the group consisting of titanium, titanium nitride, tantalum, tantalum nitride and combinations thereof. In one example, core conductor 177 comprises tungsten.

In the first embodiment of the present invention, exemplary pedestal 125 comprises:

(1) formed in a dielectric layer 180 formed on top of dielectric layer 170, a first wiring level dual-damascene wire segment 185 comprising a conductive liner 186 and a core conductor 187 and having a wire portion 190 and at least one via portion 195;

(2) formed in a dielectric layer 200 formed on top of dielectric layer 180, a second wiring level dual-damascene wire segment 205 comprising a conductive liner 206 and a core conductor 207 and having a wire portion 210 and at least one via portion 215;

(3) formed in a dielectric layer 220 formed on top of dielectric layer 200, a third wiring level dual-damascene wire segment 225 comprising a conductive liner 226 and a core conductor 227 and having a wire portion 230 and at least one via portion 235;

(4) formed in a dielectric layer 240 formed on top of dielectric layer 220, a least one last single damascene via 245 comprising a conductive liner 246 and a core conductor 247; and (5) formed in a dielectric layer 250 formed on top of dielectric layer 240, a last wiring level single damascene wire segment 255 comprising a conductive liner 257 and a core conductor 258.

The fabrication level of wire segment 185 may be designated metal 1 level (M1), the fabrication level of wire segment 205 may be designated as metal 2 level (M2), the fabrication level of wire segment 225 may be designated as metal 3 level (M3), the fabrication level of vias 245 may be designated as last via level (LV) and the fabrication level of wire segment 255 may be designated as last metal level (LM). The wiring level immediately below LM (excepting LV), may be designated (LM-1). For the purposes of the present invention, vias 245 may be considered wire segments and LV may be considered a wiring level.

Figure 10:
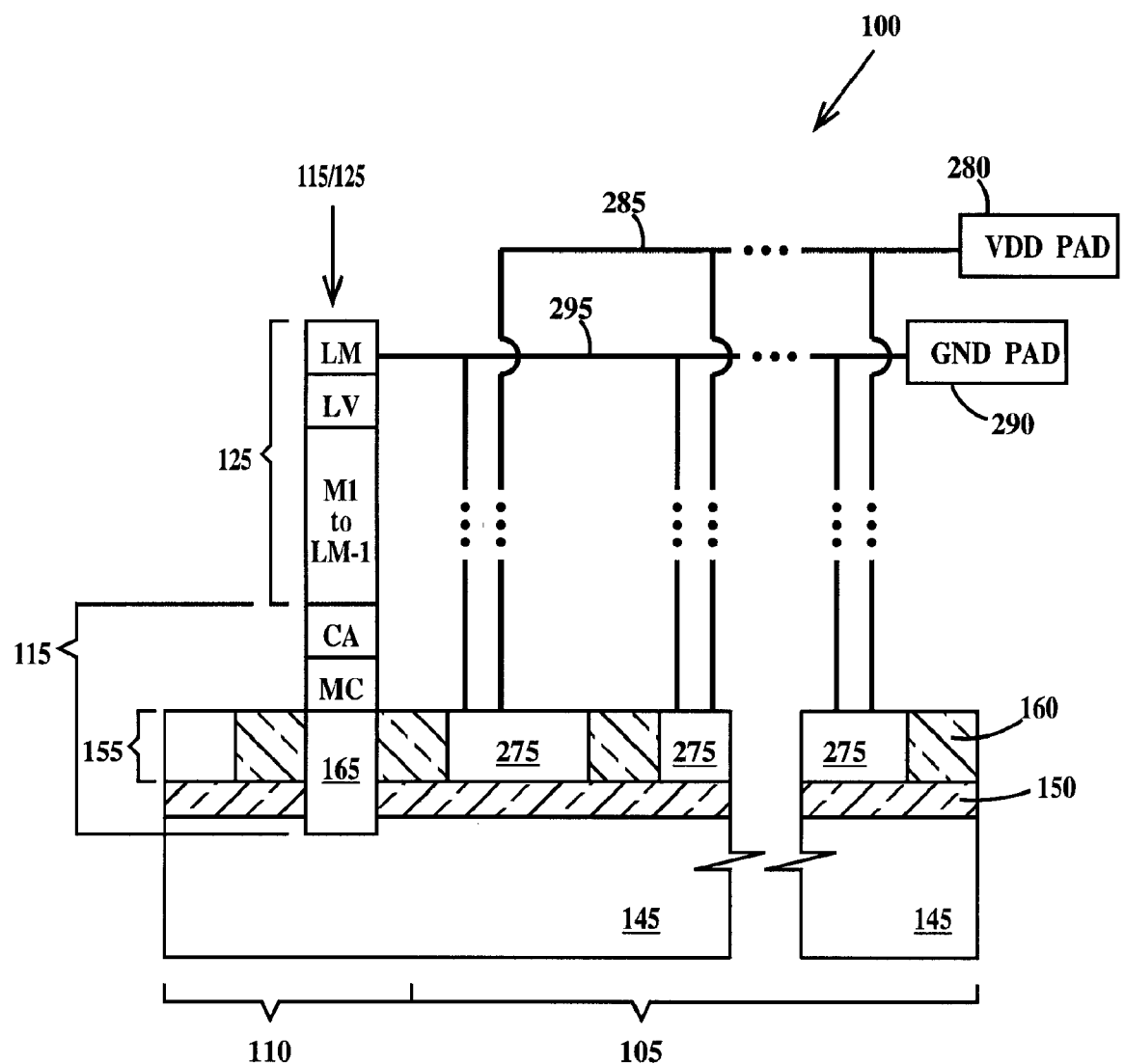
FIG. 10 is a diagram illustrating power and ground network wiring to the various charge dissipation structures of the various embodiments of the present invention.

Contact guard ring 175 is in direct electrical and physical contact with polysilicon or tungsten guard ring 165, wire segment 185 is in direct electrical and physical contact with contact guard ring 175, wire segment 205 is in direct physical and electrical contact with wire segment 185, wire segment 225 is in direct physical and electrical contact with wire segment 205, vias 245 are in direct electrical and wiring segment 225 and wire segment 255 is in direct electrical and physical contact with vias 245. Thus, there is a continuous electrical path from bulk substrate 145 through polysilicon or tungsten guard ring 165, contact guard ring 175, wire segment 185, wire segment 205, wire segment 225 vias 245 and wiring segment 255. However, except for wire segment 255 (as illustrated in FIG. 10 and described infra), there is no direct physical connection between circuits in functional circuit region 105 and guard ring 115 or pedestal 125 except as illustrated in FIG. 10 and described infra.

Pedestal 125 has a maximum width W2 and a corresponding maximum length L2, (not shown, see FIGS. 9A, 9B, 9C and 9D) in a direction perpendicular to the width W2. In FIG. 2 the widths of wire segments 185, 205, 225 and 255 are the same. Alternatively, the widths of wire segments 185, 205, 225 and 255 may vary, but the width (and length) of any particular wire segment 185, 205, 225 and 255 may not exceed W2 (or the length exceed L2). In one example, wiring segment 255 may have a width (and/or length) greater than the width (and/or length) of wire segment 225. In one example, wiring segment 225 may have a width (and/or length) greater than the width (and/or length) of wire segment 205. In one example, wiring segment 205 may have a width (and/or length) greater than the width (and/or length) of wire segment 185. In one example, wiring segment 185 may have a width greater than the width (W1) of contact ring 165.

More or less wiring levels than the three illustrated in FIG. 2 may be employed.

In one example, conductive liners 186, 206, 226, 246 and 257 are independently selected from the group consisting of titanium, titanium nitride, tantalum, tantalum nitride and combinations thereof. In one example, core conductors 187, 207, 225 comprise copper. In one example, core conductor 227 comprises tungsten. In one example, core conductor 258 comprises copper, aluminum or copper/copper.

Figure 3:
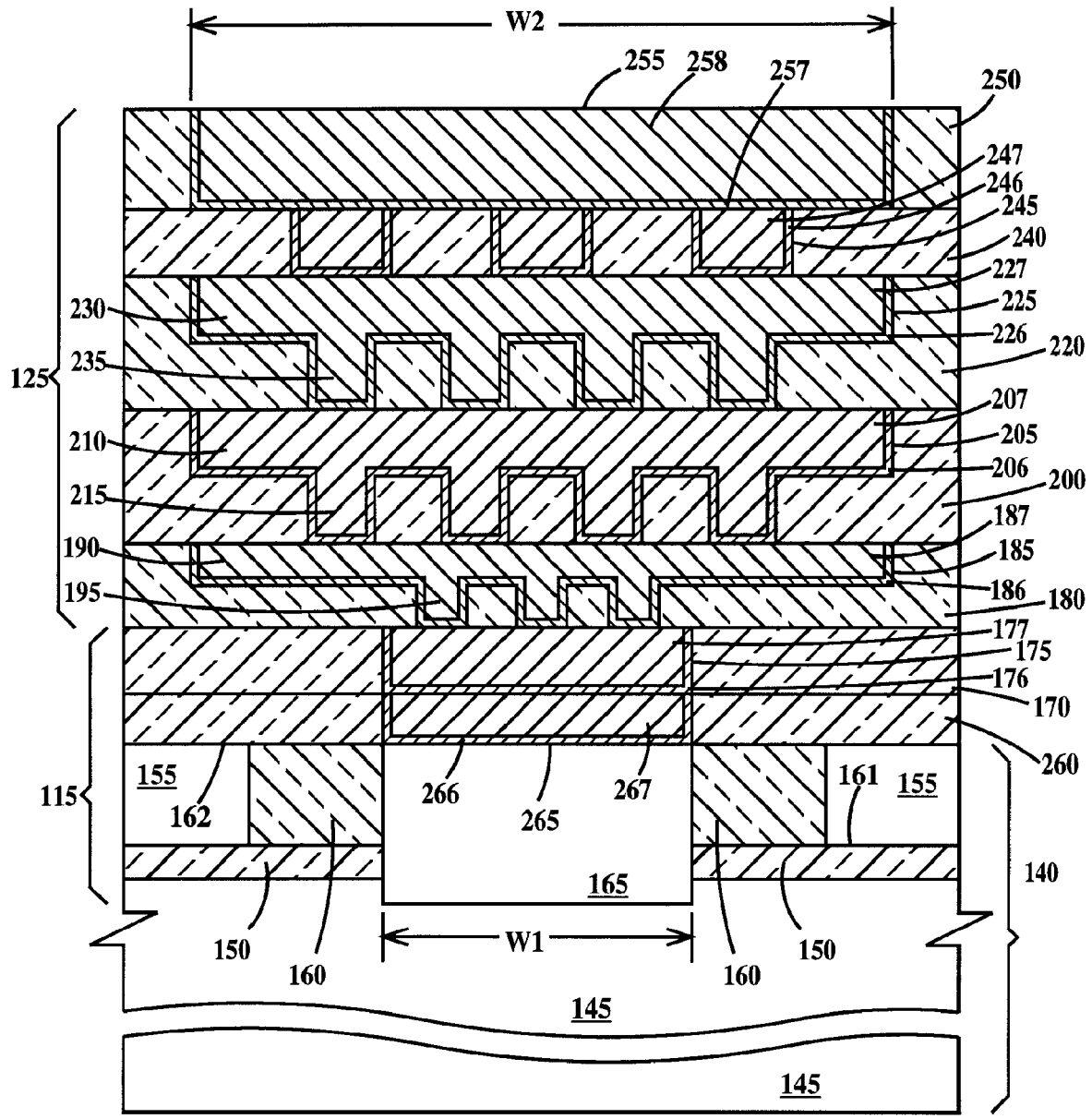
FIG. 3 is a cross-section through line 3-3 of FIG. 1, illustrating a second embodiment of the present invention.

FIG. 3 is a cross-section through line 3-3 of FIG. 1, illustrating a second embodiment of the present invention. FIG. 3 is similar to FIG. 2 except guard ring 115 further comprises: formed in a dielectric layer 260 disposed between dielectric layers 170 and 180, an additional single damascene contact guard ring 265 comprising a conductive liner 266 and a core conductor 267. The fabrication level of additional contact guard ring 265 may be designated as metal contact wire level (MC).

Figure 4:
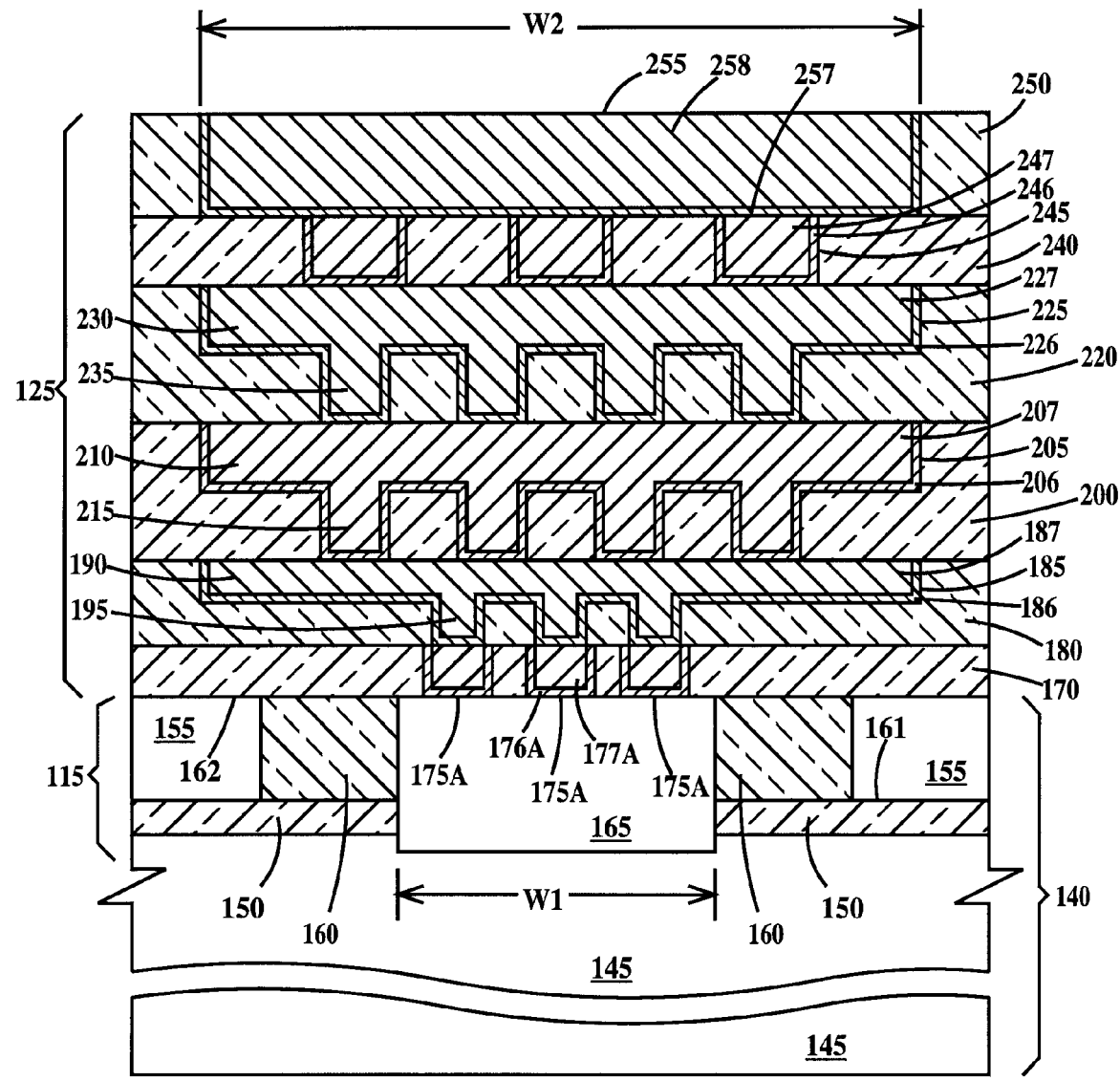
FIG. 4 is a cross-section through line 4-4 of FIG. 1, illustrating a third embodiment of the present invention.

FIG. 4 is a cross-section through line 4-4 of FIG. 1, illustrating a third embodiment of the present invention. FIG. 4 is similar to FIG. 2 except guard ring 115 does not include contact guard ring 175 (see FIG. 2) and guard ring 125 further comprises individual single damascene contacts (or contact studs) 175A each comprising an electrically conductive line 176A and a core conductor 177A. In one example, conductive liner 176A is selected from the group consisting of titanium, titanium nitride, tantalum, tantalum nitride and combinations thereof. In one example, core conductor 177A comprises tungsten.

Figure 5:
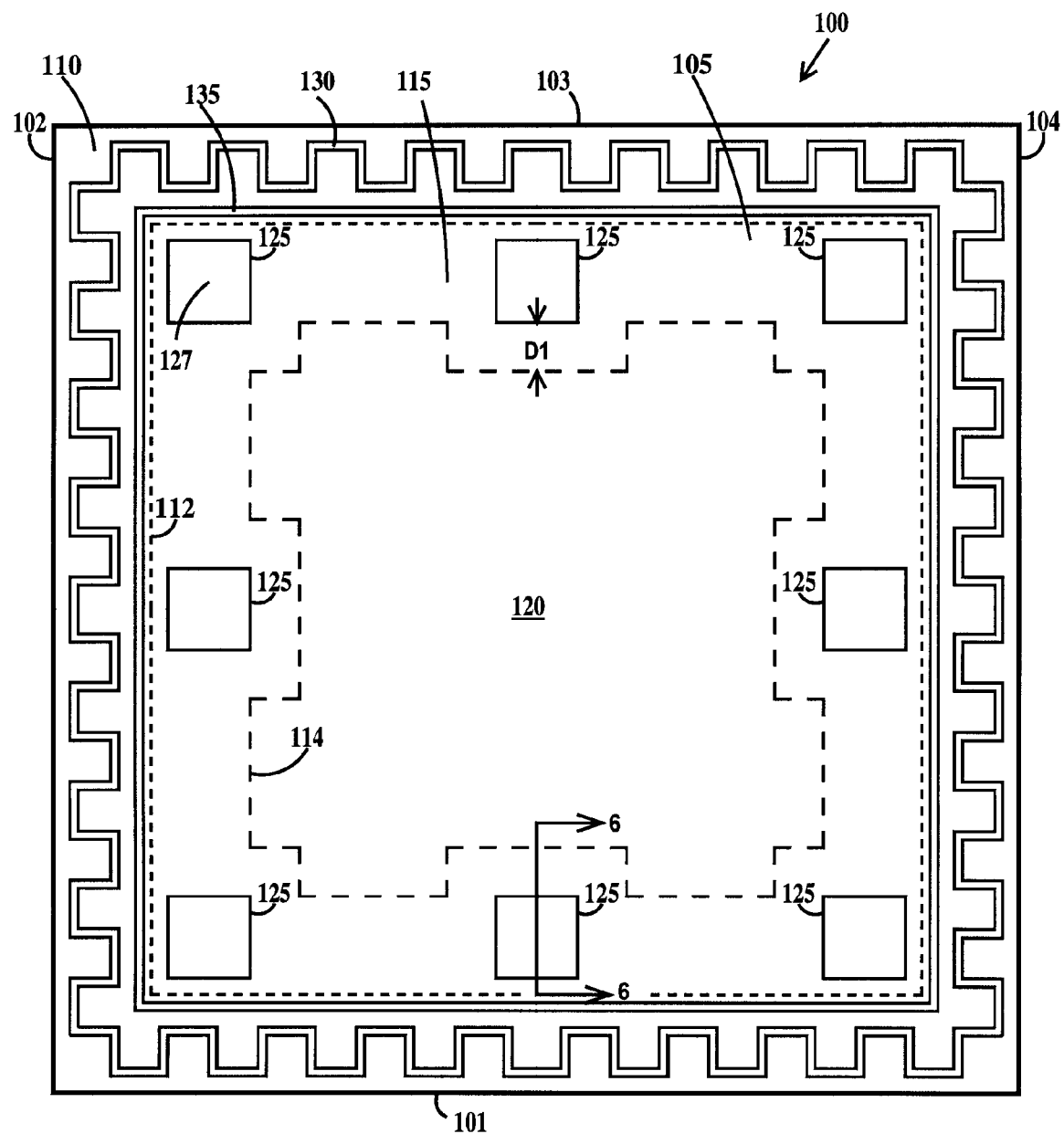
FIG. 5 is a plan view of an integrated circuit chip according to alternative embodiments of the present invention.

FIG. 5 is a plan view of an integrated circuit chip according to alternative embodiments of the present invention. FIG. 5 is similar to FIG. 1 except there is no guard ring 115 (see FIG. 1).

Figure 6:
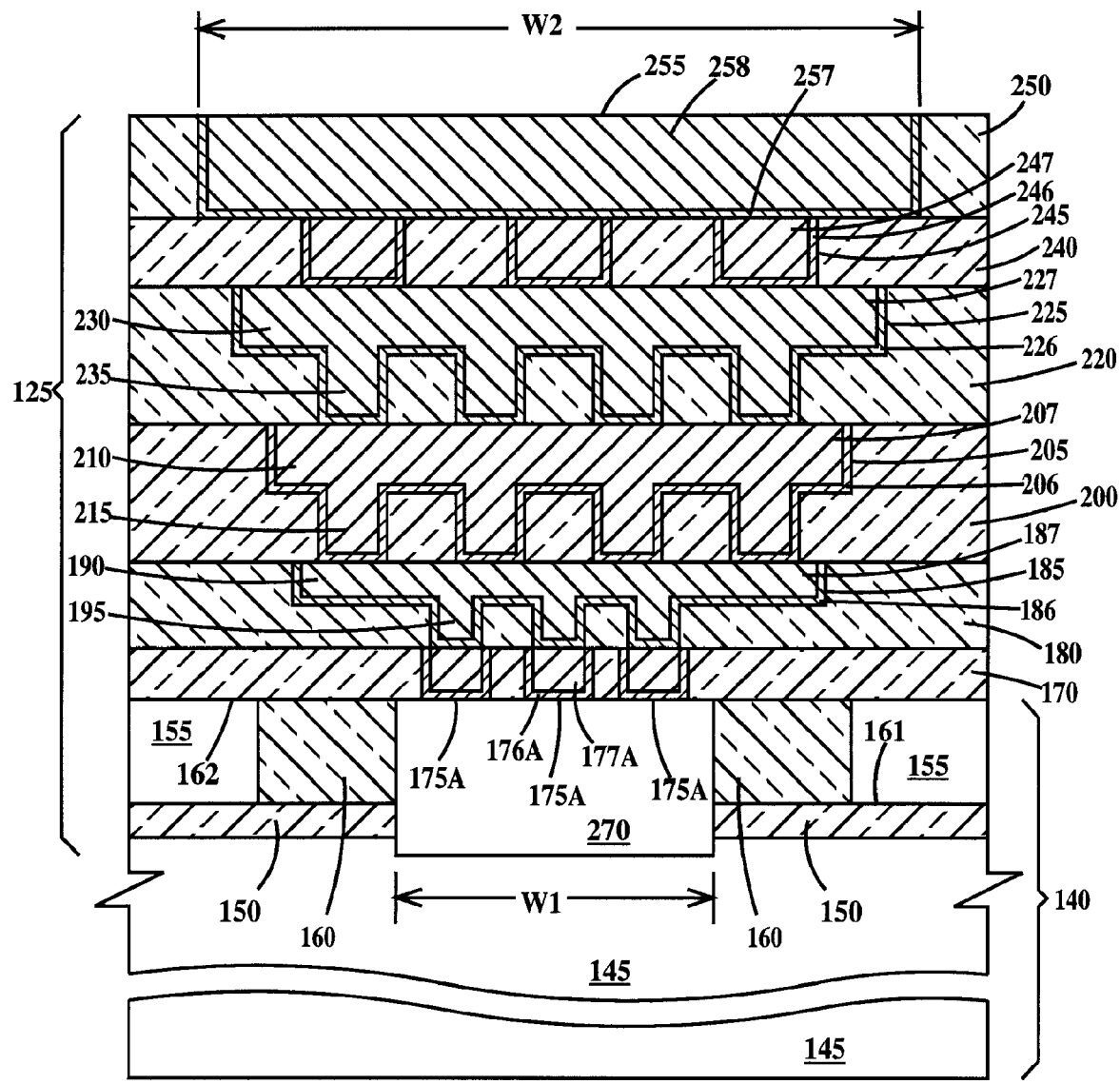
FIG. 6 is a cross-section through line 6-6 of FIG. 5, illustrating a fourth embodiment of the present invention.

FIG. 6 is a cross-section through line 6-6 of FIG. 5, illustrating a fourth embodiment of the present invention. FIG. 6 is similar to FIG. 4, except that, since there is no guard ring, pedestal 125 further includes a discrete polysilicon contact 270 extending between top surface 162 of substrate 140, through box 155 and into bulk silicon substrate 145. Polysilicon contact is isolated from silicon layer 155 by STI 160. In a first example, polysilicon contact 270 comprises undoped polysilicon. In second example, polysilicon contact 270 comprises N or P doped polysilicon. Also illustrated in FIG. 6, is the alternative where the widths of the individual wire segments 185, 205, 225 and 255 vary (as described supra), the width increasing from wire segment 185 to wire segment 255. However, the widths (and lengths of wire segments 185, 205, 225 and 255 may all be the same width W2 (and length L2).

Figure 7:
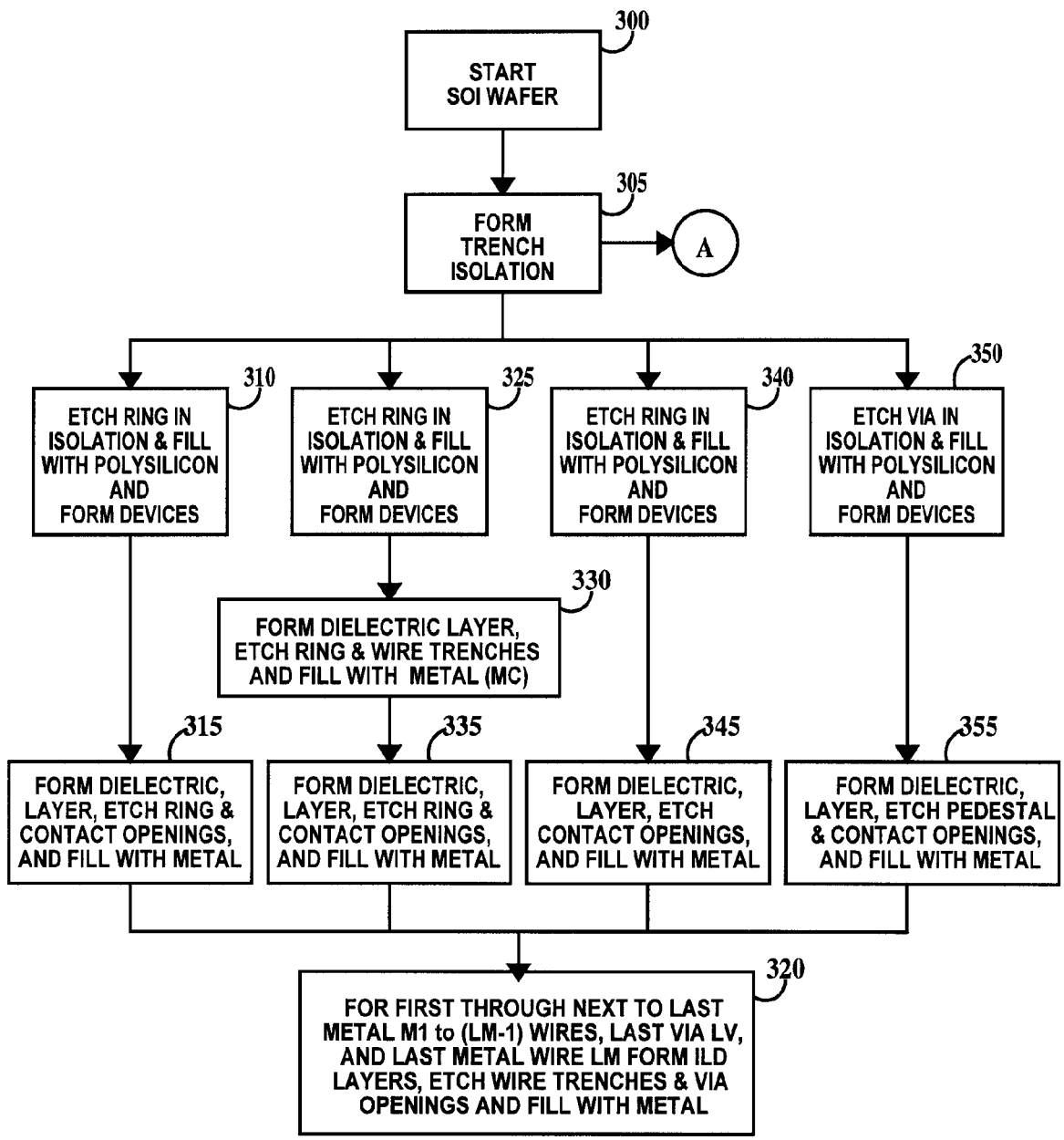
FIG. 7 is a flowchart illustrating fabrication options of a charge dissipation structure for an integrated circuit chip according to the present invention.

FIG. 7 is a flowchart illustrating fabrication options of a charge dissipation structure for an integrated circuit chip according to the present invention. In a first method, in step 300, a SOI wafer is cleaned preparatory to forming an array of individual integrated circuit chips. In step 305, an STI pattern is formed in the silicon layer in both kerf and functional circuit regions of each integrated circuit chip. In step 310, a guard ring trench is etched through the STI and BOX layer of the SOI substrate and filled with doped or undoped polysilicon to form a polysilicon guard ring. Next, active and passive devices fabricated in the kerf and functional circuit regions of each integrated circuit. In step 315, CA level is fabricated including forming a dielectric layer on the silicon layer, simultaneously forming, in the dielectric layer, a guard ring trench over the polysilicon guard ring and contact openings over active and passive devices. The guard ring trench and contact openings are simultaneously filled with metal to form a contact guard ring and contacts to devices. In step 320, for M1, M2, . . . (LM-1), LV and LM dielectric layers are deposited and single or dual-damascene wires and single damascene vias formed. Some of the damascene structures comprise the pedestals and are formed over the guard ring (or lower levels of the pedestal in some alternatives) and some of the damascene structures comprise function integrated circuit wiring.

After intervening steps, terminal pad fabrication and test, the wafer is diced between guard rings and/or pedestals into individual integrated circuit chips. The guard rings/pedestals are left intact and operational by the dicing step.

In a second method, after step 305 and in step 325, a guard ring trench is etched through the STI and BOX layer of the SOI substrate and filled with doped or undoped polysilicon to form a polysilicon guard ring. Next, active and passive devices fabricated in the kerf and functional circuit regions of each integrated circuit. In step 330, MC level is fabricated including forming a dielectric layer on the silicon layer, simultaneously forming, in the dielectric layer, a guard ring trench over the polysilicon guard ring and device single damascene wires over active and passive devices. The guard ring trench and contact openings are simultaneously filled with metal to form a first contact guard ring and wires connecting devices. In step 335, CA level is fabricated including forming a second dielectric layer on the first dielectric layer, simultaneously forming, in the second dielectric layer, a guard ring trench over the first guard ring and contact openings over active and passive devices. The guard ring trench and contact openings are simultaneously filled with metal to form a second contact guard ring and contacts to devices and optionally, to the MC level wires. The method then proceeds to step 320.

In a third method, after step 305 and in step 340, a guard ring trench is etched through the STI and BOX layer of the SOI substrate and filled with doped or undoped polysilicon to form a polysilicon guard ring. Next, active and passive devices fabricated in the kerf and functional circuit regions of each integrated circuit. In step 345, CA level is fabricated including forming a dielectric layer on the silicon layer, simultaneously forming, in the dielectric layer, contact openings over selected areas of the polysilicon guard ring and contact openings over active and passive devices. The contact openings are simultaneously filled with metal to form a contact portion of one or more pedestals and contacts to devices. The method then proceeds to step 320.

In a fourth method, after step 305 and in step 350, a individual contact openings are etched through the STI and BOX layer of the SOI substrate and filled with doped or undoped polysilicon to form a polysilicon contacts of a pedestal. Next, active and passive devices fabricated in the kerf and functional circuit regions of each integrated circuit. In step 355, CA level is fabricated including forming a dielectric layer on the silicon layer, simultaneously forming, in the dielectric layer, contact openings over selected areas of the polysilicon guard ring and contact openings over active and passive devices. The contact openings are simultaneously filled with metal to form a contact portion of one or more pedestals and contacts to devices. The method then proceeds to step 320.

In a fifth method (not illustrated in FIG. 7), after step 305, only active and passive devices are fabricated in the kerf and functional circuit regions of each integrated circuit formed and a guard ring trench is etched through the STI and BOX layer of the SOI substrate and filled with tungsten, a conductive liner (e.g. Ti, TiN, Ta, TaN or combinations thereof) and a tungsten core, or other metals to form a metal guard ring. The process then proceeds to step 335.

Figure 8:
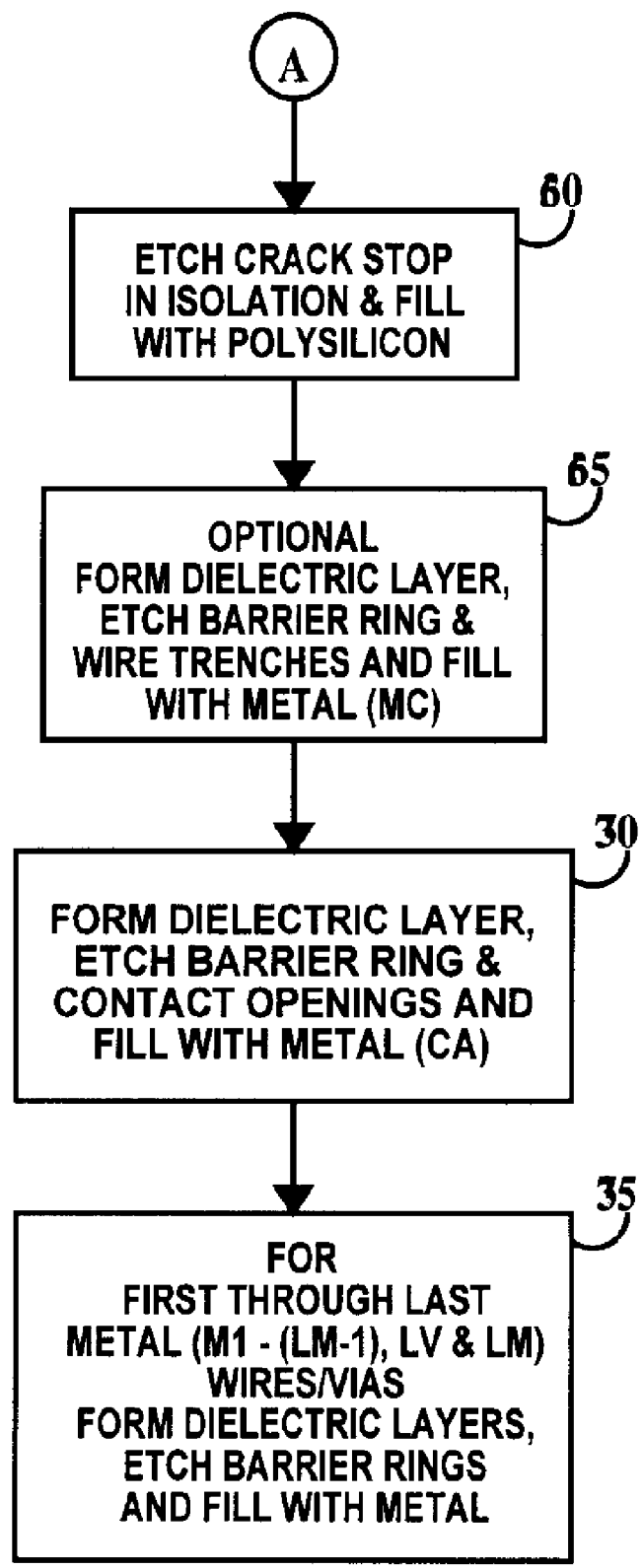
FIG. 8 is a flowchart illustrating fabrication options of various protection structures that may be fabricated in conjunction with charge dissipation structure according to the various embodiments of the present invention.

FIG. 8 is a flowchart illustrating fabrication options of various protection structures that may be fabricated in conjunction with charge dissipation structure according to the various embodiments of the present invention. The optional serpentine crack stop (130, see FIG. 1 or 5) described supra is simultaneously formed with the polysilicon guard ring described supra and the optional barrier (135, see FIG. 1 or 5) described supra is simultaneously formed with CA, optional MC and M1 through LV and LM described supra.

In step 360, a crack stop trench is etched in the STI immediately adjacent to the periphery of each integrated circuit chip. and through the BOX and filled with polysilicon to form a crack stop. In step 365, an optional dielectric layer is formed on top of the silicon layer of the SOI substrate and a ring trench etched in the optional dielectric layer and filled with metal (MC) to form a first barrier ring. In step 370, if step 365 is not performed, a dielectric layer is formed on top of the silicon layer (if there was no MC) of the SOI substrate and filled with metal (CA) to form a contact barrier ring. In step 370, if step 365 was performed, a dielectric layer is formed on top of the dielectric layer of step 365 and a ring trench aligned over the and the first barrier ring and etched in the dielectric and filled with metal (CA) to form a second barrier ring.

In step 375, for each fabrication level M1 through (LM-1), LV and LM, a corresponding dielectric layer is formed over the immediately previously formed dielectric layer, a trench aligned over the previously formed barrier ring and etched in the current dielectric layer and filled with metal to form respective barrier rings M1 through (LM-1), barrier rings LV and barrier rings LM.

The top surface of each lower metal ring in the sequence MC (if present), CA, M1 through MN, LV and LM is in contact with a bottom surface of an immediately higher metal ring in the sequence of barrier rings with no gaps between rings.

Figure 9A:
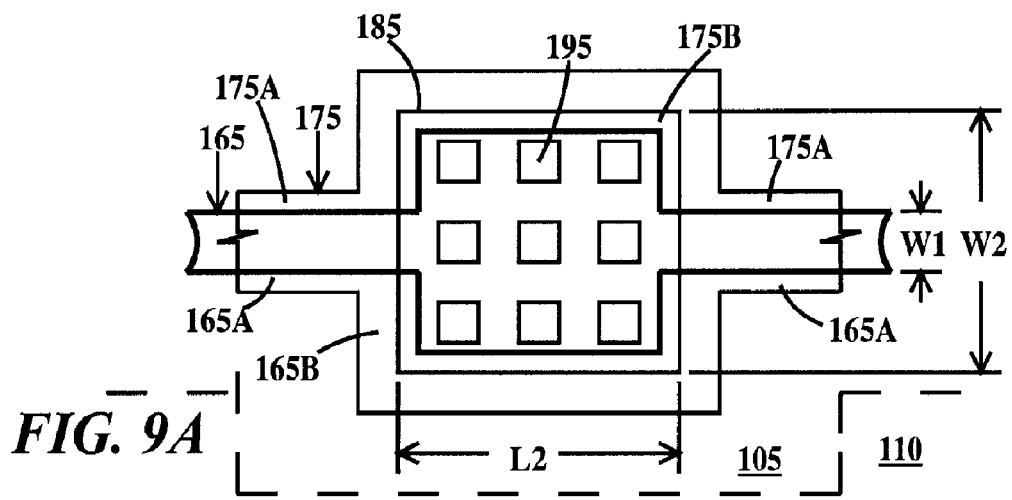
FIGS. 9A, 9B, 9C and 9D are plan views illustrating alternative layouts of charge dissipation structures according to the various embodiments of the present invention.
Figure 9B:
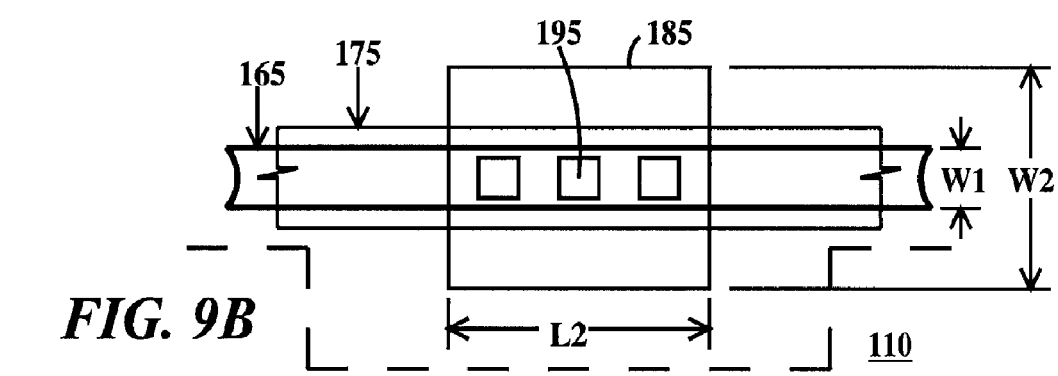
Figure 9C:
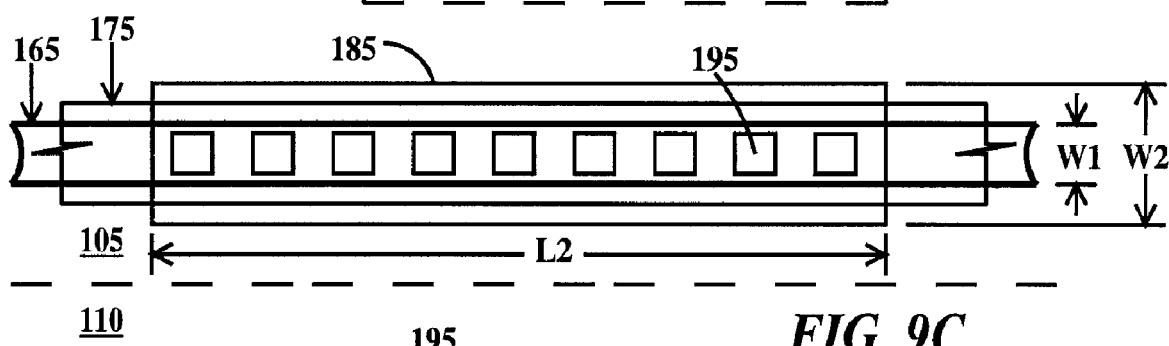

FIGS. 9A, 9B, 9C and 9D are plan views illustrating alternative layouts of charge dissipation structures according to the various embodiments of the present invention. In FIGS. 9A, 9B, 9C and 9D only a portion of the guard ring is illustrated and only the first wiring level of the dissipation pedestal is illustrated. The directions of dimensions W1, W2 and L2 described supra are illustrated in FIGS. 9A, 9B, 9C and 9D as well. While W1 is illustrated in FIGS. 9A, 9B and 9C as less than W2, W1 may equal W2 or W2 may be greater than W1.

In FIG. 9A, polysilicon or tungsten guard ring 165 includes a ring region 165A having width W1 and an integral wider pad region 165B. A contact guard ring 175 includes a ring region 175A and an integral wider pad region 175B. A first dual damascene wiring level wire segment 185 (the lowermost portion of a charge dissipation pedestal as described supra) having a length L2 and a width W2 includes an array of vias 195 in direct physical and electrical contact with pad region 175B of contact guard ring 175. This arrangement of vias 195 over pad region 175B provides sufficient area to allow large quantities of charge to pass from the pedestal into the guard ring and into the bulk substrate without overloading and damaging the pedestal or being unable to sink all the charge that may build up in the functional circuit region quickly enough to prevent functional circuit damage.

FIG. 9B is similar to FIG. 9A except there are no pad regions of tungsten or polysilicon guard rings 165 or of contact guard rings 175. Thus, first dual damascene wiring level wire segment 185 includes only a single row of vias 195.

FIG. 9C is similar to FIG. 9A except there are no pad regions of tungsten or polysilicon guard rings 165 or of contact guard rings 175. Thus, first dual damascene wiring level wire segment 185 includes only a single row of vias 195. The jogs around pedestals required in FIGS. 9A and 9B are eliminated in the layout of FIG. 9C, while still providing a large total via area.

Figure 9D:
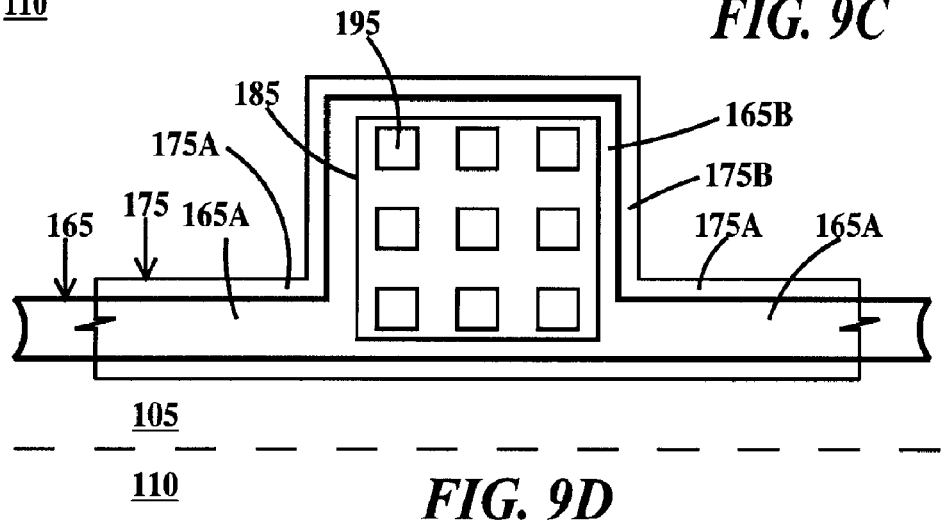

FIG. 9D is similar to FIG. 9A except pad regions 165B of tungsten or polysilicon guard rings 165 and pad regions 175B of contact guard rings 175 are offset away from functional circuit region 105, eliminating the jogs around pedestals required in the layouts of FIGS. 9A and 9B.

The layout of first dual damascene wiring level wire segment 185 as illustrated in FIGS. 9A, 9B, 9C and 9D may be used in embodiments of the present invention that use pedestals only and do not use guard rings.

When there is more than one pedestal in an integrated circuit chip, the structure of each pedestal may be independently selected from any of the embodiments of the present invention hereto described.

FIG. 10 is a diagram illustrating power and ground network wiring to the various charge dissipation structures of the various embodiments of the present invention. In FIG. 10, guard ring 105/pedestal 125 includes polysilicon or tungsten guard ring 165, contact guard ring 175 (CA), optional additional guard ring 265 (MC), pedestal wire segments from the first wiring level (M1) to the next to last wiring level (LM-1), last via level (LV) and last wire segment in the last wiring level (LM). Silicon layer 155 is divided in silicon wells 260 by STI 160. Devices such as field effect and bipolar transistors, resistors and capacitors that comprise the functional integrated circuit of integrated circuit chip 100 are formed in silicon wells 260. A VDD pad 280 supplies power to a VDD power network 285 to supply power to the aforementioned devices. A GND pad 295 supplies a ground source to a ground network 295 to supply power to the aforementioned devices. Ground network 295 is physically and electrically connected to each pedestal 125 (only one shown in FIG. 10) at the LM wiring level. Bulk substrate 145 is thus held at ground potential.

Figure 11:
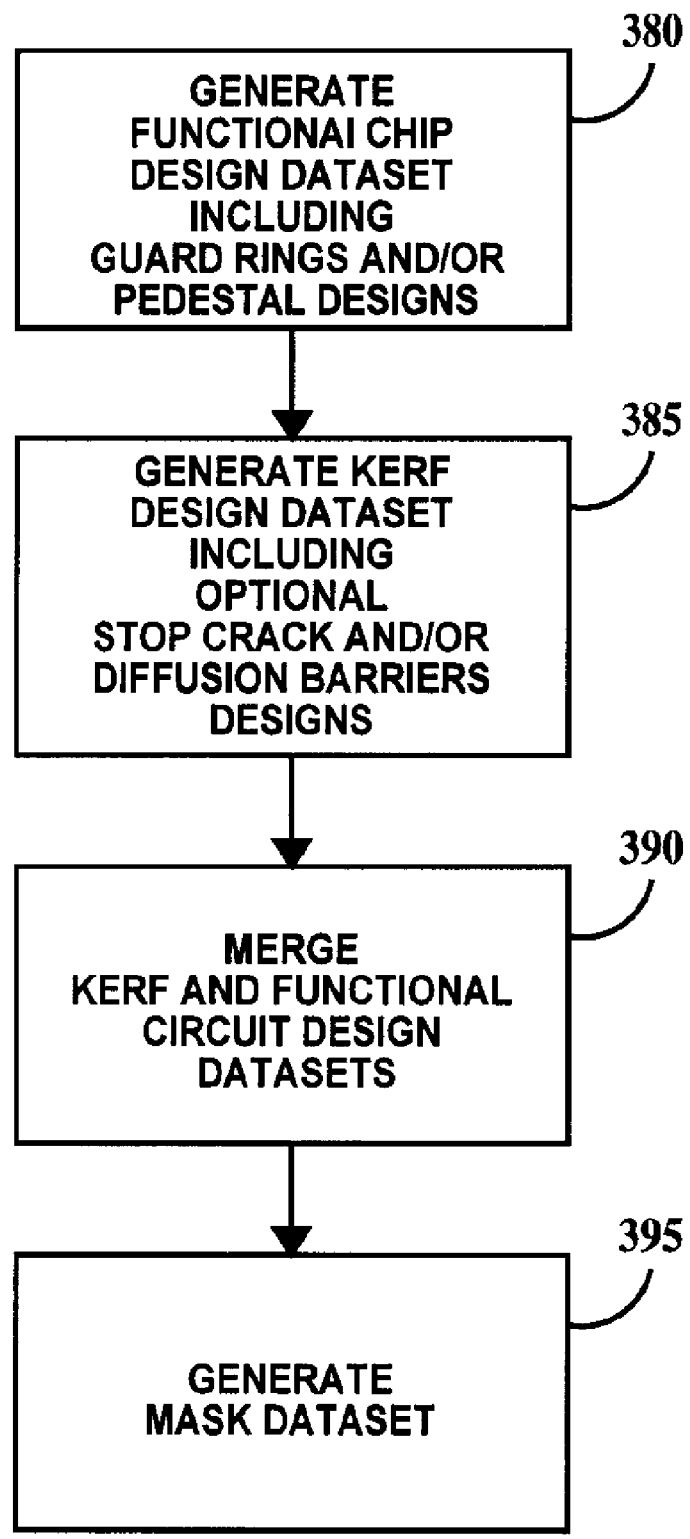
FIG. 11 is a flowchart illustrating the design methodology of an integrated circuit chips according to the various embodiments of the present invention.

FIG. 11 is a flowchart illustrating the design methodology of an integrated circuit chips according to the various embodiments of the present invention. In step 380, a functional circuit design dataset is generated including functional circuit elements and guard rings and/or pedestals. In step 385, a kerf design dataset is generated including kerf test and process monitoring circuit elements, diffusions barriers and/or crack stops. In step 390, the functional circuit and kerf design datasets are merged together into a integrated circuit chip design dataset. In step 395, a mask dataset is generated from the integrated circuit chip dataset. The mask dataset may then be used to fabricate integrated circuits having charge dissipation structures according to one or more of the various embodiments of the present invention.

Figure 12:
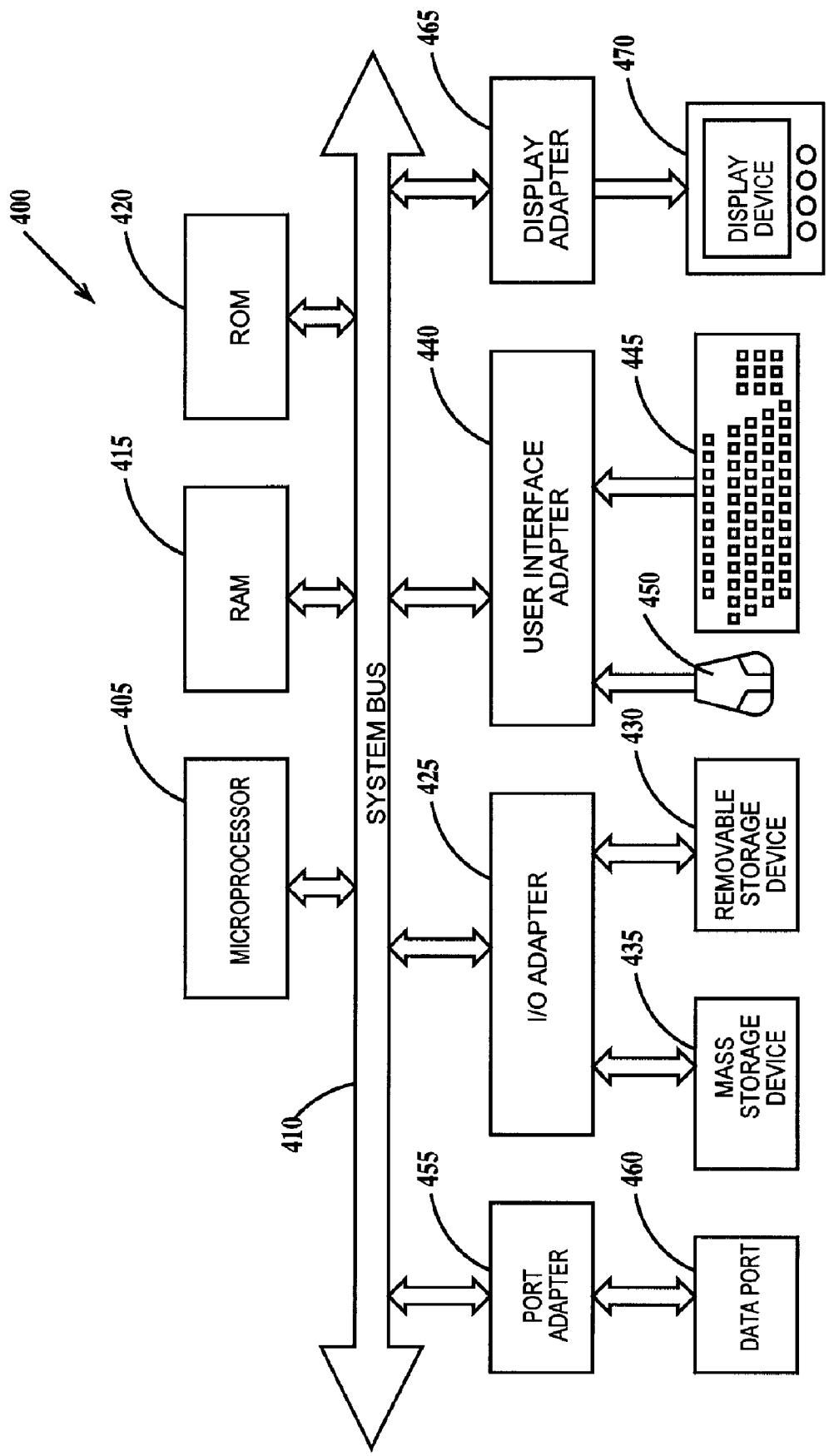
FIG. 12 is a schematic block diagram of a general-purpose computer for practicing the present invention.

Generally, the method described herein with respect to the design methodology of an integrated circuit chips according to the various embodiments of the present invention is practiced with a general-purpose computer and the method may be coded as a set of instructions on removable or hard media for use by the general-purpose computer. FIG. 12 is a schematic block diagram of a general-purpose computer for practicing the present invention.

In FIG. 12, computer system 400 has at least one microprocessor or central processing unit (CPU) 405. CPU 405 is interconnected via a system bus 410 to a random access memory (RAM) 415, a read-only memory (ROM) 420, an input/output (I/O) adapter 425 for a connecting a removable data and/or program storage device 430 and a mass data and/or program storage device 435, a user interface adapter 440 for connecting a keyboard 445 and a mouse 450, a port adapter 455 for connecting a data port 460 and a display adapter 465 for connecting a display device 470.

ROM 420 contains the basic operating system for computer system 400. The operating system may alternatively reside in RAM 415 or elsewhere as is known in the art. Examples of removable data and/or program storage device 430 include magnetic media such as floppy drives and tape drives and optical media such as CD ROM drives. Examples of mass data and/or program storage device 435 include hard disk drives and non-volatile memory such as flash memory. In addition to keyboard 445 and mouse 450, other user input devices such as trackballs, writing tablets, pressure pads, microphones, light pens and position-sensing screen displays may be connected to user interface 440. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for or the computer program created to run the present invention is loaded on the appropriate removable data and/or program storage device 430, fed through data port 460 or typed in using keyboard 445.

Therefore, the various embodiments of the present invention provide improved charge dissipation structures, methods of fabricating improved charge dissipation structures and methods for designing integrated circuit chips having the improved charge dissipation structures.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention.

For example, the charge dissipation guard ring may be disposed within the functional circuit region of the integrated circuit chip, one or more or all of the charge dissipation pedestals may be disposed within the functional circuit region of the integrated circuit chip or both the charge dissipation guard ring and one or more or all of the charge dissipation pedestals may be disposed within the functional circuit region of the integrated circuit chip.

Therefore, it is intended that the following claims cover all such modifications and changes as fall within the true spirit and scope of the invention.

What is claimed is:

1. An integrated circuit chip, comprising:
    an silicon on insulator substrate comprising a bulk silicon substrate, a buried oxide layer on a top surface of said bulk silicon substrate, and a silicon layer on a top surface of said buried oxide layer, said buried oxide layer electrically isolating said silicon layer from said bulk silicon substrate;
    a region of shallow trench isolation formed in said silicon layer and extending from said top surface of said buried oxide layer to a top surface of said silicon layer;
    a charge dissipation guard ring comprising a continuous polysilicon ring disposed adjacent to sides of said integrated circuit chip and at least a continuous band of a metal contact ring aligned over and in direct physical and electrical contact with a corresponding continuous band of a top surface of said polysilicon ring, of said metal contact ring in said polysilicon ring extending from a top surface of said region of shallow trench isolation, through said shallow trench isolation and through said buried oxide layer in direct physical and electrical contact with said bulk silicon substrate, said polysilicon ring electrically isolated from said silicon layer by said region of shallow trench isolation; and
    one or more charge dissipation pedestals, each charge dissipation pedestal of said one or more charge dissipation pedestals comprising a stack of wire segments from a lowermost to a higher most wire segment of each wiring level of said integrated circuit chip, a lowermost wire segment of said stack of wire segments in direct physical and electrical contact with said metal contact ring, each wire segment of said stack of wire segments in direct physical and electrical contact with a lower and a higher wire segment.

2. The integrated circuit chip of claim 1, wherein said continuous metal contact ring comprises a lower continuous ring and a separate upper continuous ring, a continuous band of a top surface of said lower continuous ring in direct physical and electrical contact with a continuous band of a bottom surface of said upper continuous ring.

3. The integrated circuit chip of claim 1, further including:
    a functional circuit region containing an integrated circuit, said functional circuit region disposed within and spaced at least a first predetermined distance from said guard ring and spaced at least a second predetermined distance from each of said one or more charge dissipation pedestals.

4. The integrated circuit chip of claim 3, wherein said first and second predetermined distances are a same distance.

5. The integrated circuit chip of claim 3, wherein said integrated circuit includes a ground distribution grid electrically coupled to said silicon layer and physically and electrically connected to said uppermost wire segment of at least one of said one or more charge dissipation pedestals.

6. The integrated circuit chip of claim 1, further including:
    a functional circuit region containing an integrated circuit, either said guard ring and at least one of said one or more charge dissipation pedestals disposed within said functional circuit region or at least one of said one or more charge dissipation pedestals disposed within said functional circuit region.

7. The integrated circuit chip of claim 1, wherein said integrated circuit includes a ground distribution grid electrically coupled to said silicon layer and physically and electrically connected to said uppermost wire segment of at least one of said one or more charge dissipation pedestals.

8. The integrated circuit chip of claim 1, wherein said one or more of said one or more charge dissipation pedestals are disposed over one or more different corners of said guard ring, over one or more sides of said guard ring or both over one or more different corners of and one or more sides of said guard ring.

9. The integrated circuit chip of claim 1, further including a continuous crack stop disposed between said sides of said integrated circuit chip and said charge dissipation guard ring and charge dissipation pedestals.

10. An integrated circuit chip, comprising; a silicon on insulator substrate comprising a bulk silicon substrate, a buried oxide layer on a top surface of said bulk silicon substrate, and a silicon layer on a top surface of said buried oxide layer, said buried oxide layer electrically isolating said silicon layer from said bulk silicon substrate;
    a region of shallow trench isolation formed in said silicon layer and extending from said top surface of said buried oxide layer to a top surface of said silicon layer; and
    one or more charge dissipation pedestals, each charge dissipation pedestal of said one or more charge dissipation pedestals comprising:
        a polysilicon, tungsten or other electrically conductive material filled trench disposed proximate to a side or a corner of said integrated circuit chip and one or more metal contact studs, each aligned over and in direct physical and electrical contact with a top surface of said filled trench, said filled trench extending from a top surface of said region of shallow trench isolation, through said region of shallow trench isolation and through said buried oxide layer in direct physical and electrical contact with said bulk silicon substrate, said filled trench electrically isolated from said silicon layer by said region of shallow trench isolation; and a stack of wire segments from a lowermost to a highermost wire segment of each wiring level of said integrated circuit chip, a lowermost wire segment of said stack of wire segments in direct physical and electrical contact with each of said one or more metal contact studs, each wire segment of said stack of wire segments in direct physical and electrical contact with a lower and a higher wire segment.

11. The integrated circuit chip of claim 10, wherein said each of said one or more metal contact studs comprises a lower contact stud or wire segment and a separate upper contact stud, a top surface of said lower stud contact or wire segment in direct physical and electrical contact with a bottom surface of said upper contact stud.

12. The integrated circuit chip of claim 10,
wherein said charge dissipation pedestals are all located adjacent to sides of said integrated circuit chip; and
further including a functional circuit region containing an integrated circuit, said functional circuit region disposed within said integrated circuit chip, said functional circuit region spaced at least a predetermined distance from each of said one or more charge dissipation pedestals.

13. The integrated circuit chip of claim 12, wherein said integrated circuit includes a ground distribution grid electrically coupled to said silicon layer and physically and electrically connected to said uppermost wire segment of at least one of said one or more charge dissipation pedestals.

14. The integrated circuit chip of claim 10, further including a continuous crack stop disposed between said sides of said integrated circuit chip and said charge dissipation pedestals.

15. The integrated circuit chip of claim 10, further including:
a functional circuit region containing an integrated circuit, said functional circuit region disposed within said integrated circuit chip, one or more of said one or more charge dissipation pedestals disposed within said functional circuit region.

16. The integrated circuit chip of claim 15, wherein said integrated circuit includes a ground distribution grid electrically coupled to said silicon layer and physically and electrically connected to said uppermost wire segment of at least one of said one or more charge dissipation pedestals.

* * * * *